(12) United States Patent
Okamoto et al.

(10) Patent No.: US 7,386,293 B2
(45) Date of Patent: Jun. 10, 2008

(54) RECEIVING CIRCUIT

(75) Inventors: Naoki Okamoto, Takatsuki (JP); Junji Ito, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 365 days.

(21) Appl. No.: 10/942,844

(22) Filed: Sep. 17, 2004

(65) Prior Publication Data

US 2005/0064841 A1    Mar. 24, 2005

(30) Foreign Application Priority Data

Sep. 18, 2003    (JP)    ............................. 2003-326684

(51) Int. Cl.
*H04B 1/28* (2006.01)
*H04B 1/06* (2006.01)

(52) U.S. Cl. .................................. 455/333; 455/232.1

(58) Field of Classification Search ................. 455/333, 455/206, 234.1, 135, 234.2, 130, 232.1, 134, 455/247.1, 136, 250.1, 140, 334, 245.1, 240.1, 455/239.1, 249.1, 343.1, 343.2; 375/344, 375/345; 330/151, 52
See application file for complete search history.

(56) References Cited

U.S. PATENT DOCUMENTS

| | | | | |
|---|---|---|---|---|
| 4,792,992 A * | 12/1988 | Rinderle | ................... | 455/239.1 |
| 4,893,349 A * | 1/1990 | Eastmond et al. | ........... | 455/205 |
| 4,955,077 A * | 9/1990 | Sugayama | ................ | 455/197.1 |
| 5,166,634 A * | 11/1992 | Narahashi et al. | ........... | 330/151 |
| 5,175,883 A * | 12/1992 | Ueno | ....................... | 455/242.2 |
| 5,390,345 A * | 2/1995 | Wada et al. | .............. | 455/234.1 |
| 5,465,406 A * | 11/1995 | Whitecar et al. | ........ | 455/234.1 |
| 6,072,998 A * | 6/2000 | Kaku | ....................... | 455/234.2 |
| 6,226,504 B1 * | 5/2001 | Takagi | ...................... | 455/234.1 |
| 6,374,097 B1 * | 4/2002 | Kudou | .................... | 455/232.1 |
| 6,670,901 B2 * | 12/2003 | Brueske et al. | .......... | 455/232.1 |
| 6,760,568 B2 * | 7/2004 | Friedlander et al. | .......... | 455/78 |
| 7,054,610 B1 * | 5/2006 | Itoh et al. | .................... | 455/324 |
| 7,085,255 B2 * | 8/2006 | Jacques et al. | .......... | 455/234.1 |

FOREIGN PATENT DOCUMENTS

| | | |
|---|---|---|
| JP | 5-335857 | 12/1993 |
| JP | 10-93667 | 4/1998 |
| JP | 10-126301 | 5/1998 |

* cited by examiner

*Primary Examiner*—Quochien B. Vuong
(74) *Attorney, Agent, or Firm*—McDermott Will & Emery LLP

(57) ABSTRACT

In a receiving circuit, an antenna 11 receives a high-frequency signal at a predetermined frequency band, a level changing section 13 changes a signal level of the high-frequency signal received by the antenna, a subsequent-stage circuit 14 performs predetermined signal processing for the high-frequency signal whose signal level is changed at the level changing section 13, a detecting section 32 detects a signal level of the high-frequency signal for which the signal processing is performed by the subsequent-stage circuit 14, and a control section 33 sets a rate of change of the high-frequency signal by the level changing section 13, based on the signal level of the high-frequency signal detected by the detecting section 32, so that the signal level of the high-frequency signal detected by the detecting section 32 does not exceed a predetermined value.

5 Claims, 9 Drawing Sheets

RECEIVING CIRCUIT

BACKGROUND OF THE INVENTION

1. Field of the Invention

The present invention relates to receiving circuits, more particularly, to a receiving circuit used in a wireless communication apparatus.

2. Description of the Background Art

With reference to the drawing, a receiving circuit used in a conventional wireless communication apparatus will be described below. The conventional wireless communication apparatus includes a mobile phone and a PHS, for example. Here, FIG. 8 is a block diagram showing a structure of the receiving circuit of the conventional wireless communication apparatus.

The receiving circuit of the wireless communication apparatus as shown in FIG. 8 includes an antenna 111, an amplifier 113, a bandlimiting filter 114, a frequency conversion circuit 115, a local oscillator 116, a bandlimiting filter 117, a frequency conversion circuit 118, and a local oscillator 119. Hereinafter, an operation of the above-described receiving circuit of the wireless communication apparatus will be briefly described.

First, a high-frequency signal is received by the antenna 111. After the received high-frequency signal is amplified by the amplifier 113, the amplified high-frequency signal passes through the bandlimiting filter 114, which is designed to pass only a required signal band, and is inputted to the frequency conversion circuit 115. Next, the high-frequency signal is mixed with a first local oscillating signal, which is outputted from the local oscillator 116, by the frequency conversion circuit 115. As a result, the high-frequency signal is converted to a first intermediate frequency signal. Then, the first intermediate frequency signal is inputted to the frequency conversion circuit 118 after passing through the bandlimiting filter 117. The first intermediate frequency signal is mixed with a second local oscillating signal, which is outputted from the local oscillator 119, by the frequency conversion circuit 118. As a result, the first intermediate frequency signal is converted to a second intermediate frequency signal. Then, various processes are performed for the second intermediate frequency signal by a circuit connected to a subsequent stage. As a result of the above-described processes, the high-frequency signal is converted to the second intermediate frequency signal.

When a user travels with the above wireless communication apparatus and approaches a base station, the wireless communication apparatus receives a high-frequency signal with a high electric field strength. In this case, a signal level of the received high-frequency signal substantially exceeds an output dynamic range of the frequency conversion circuit 115. As a result, the frequency conversion circuit 115 operates in the saturation region, thereby deteriorating reception characteristics of the receiving circuit of the wireless communication apparatus.

In order to solve the above-described problem, there exists a receiving circuit of a wireless communication apparatus as shown in FIG. 9. The receiving circuit of the wireless communication apparatus additionally includes a variable attenuator 112 between the antenna 111 and the amplifier 113. The feedback control is performed to control the amount of attenuation in the variable attenuator 112 in accordance with a signal level of a reception signal. As a result, it is possible to prevent a signal having a signal level substantially exceeding a dynamic range of the frequency conversion circuit 115 from being inputted to the frequency conversion circuit 115. Hereinafter, with reference to FIG. 9, the above receiving circuit of the wireless communication apparatus will be described.

The receiving circuit of the wireless communication apparatus includes the antenna 111, the variable attenuator 112, the amplifier 113, the bandlimiting filter 114, the frequency conversion circuit 115, the local oscillator 116, the bandlimiting filter 117, the frequency conversion circuit 118, the local oscillator 119, and a gain control section 121. Hereinafter, an operation of the receiving circuit of the wireless communication apparatus will be briefly described.

First, the operations performed by the antenna 111, the amplifier 113, the bandlimiting filter 114, the frequency conversion circuit 115, the local oscillator 116, the bandlimiting filter 117, the frequency conversion circuit 118, and the local oscillator 119 are identical to the operations performed by their counterparts in the receiving circuit as shown in FIG. 8, with the descriptions thereof omitted.

The second intermediate frequency signal outputted from the frequency conversion circuit 118 is inputted to the gain control section 121. The gain control section 121 rectifies the second intermediate frequency signal to obtain a direct current signal. Here, the variable attenuator 112 controls the amount of attenuation by using the obtained direct current signal as a gain control signal. Specifically, the variable attenuator 112 increases or decreases the amount of attenuation in accordance with a level of the gain control signal. Thus, the receiving circuit is able to vary a level of a reception signal.

As such, in the case where a reception signal with high electric field strength is inputted or a disturbing signal within a band of the bandlimiting filter 117 whose band is narrower than that of the bandlimiting filter 114 is inputted, a signal level of the second intermediate frequency signal is increased due to control of the variable attenuator 112, and a direct voltage (a gain control signal) is increased accordingly. As a result, the amount of attenuation in the variable attenuator 112 is increased, and a dynamic range of the frequency conversion circuit 115 is ensured, thereby preventing the frequency conversion circuit 115 from operating in the saturation region (for example, see Japanese Laid-Open Patent Publication No. H10-126301).

Note that, other than the above-described invention, there exists a receiving circuit of a wireless communication apparatus as disclosed in Japanese Laid-Open Patent Publication No. H10-93367 or Japanese Laid-Open Patent Publication No. H5-335857.

However, the receiving circuit as shown in FIG. 9 has the following problem. The gain control section 121 detects a level of an output signal outputted from the frequency conversion circuit 118, and performs AGC (Automatic Gain Control). Thus, in the case where a disturbing signal having a high signal level lying outside the band of the band limiting filter 117 is received, the gain control section 121 does not perform an AGC operation, which will be described below in detail with reference to the drawing. FIG. 10 is an illustration showing a high-frequency signal including a disturbing signal. Specifically, a horizontal axis represents a frequency, and a vertical axis represents a signal level.

In general, the amplifier 113 and the frequency conversion circuit 115 are required to deal with a plurality of signals having respective frequency bands. Specifically, the bandlimiting filter 114 allows signals having respective frequency bands f1 to f3 as shown in FIG. 10 to pass therethrough.

On the other hand, the bandlimiting filter 117 extracts only a required reception band. Specifically, in the case where signals as shown in FIG. 10 are inputted, the band-limiting filter 117 passes only a required signal (frequency f2). Thus, in the case where a high-frequency signal including a disturbing signal (frequency f3), whose signal level is higher than the required signal as shown in FIG. 10, is received by the receiving circuit, only the required signal (frequency f2) is outputted to the gain control section 121. In this case, gain control should be performed based on the signal level of the disturbing signal (frequency f3) having the highest signal level. However, gain control is performed based on the intensity of the required signal (frequency f2) whose signal level is lower than the disturbing signal (frequency f3). As a result, a high-frequency signal including a disturbing signal (frequency f3) which is not adequately attenuated is inputted to the frequency conversion circuit 115, whereby a reception performance of a receiver is deteriorated since the frequency conversion circuit 115 operates in the saturation region.

In addition to the above-described problem, the receiving circuit as shown in FIG. 9 makes it difficult to reduce power consumption, which will be described in detail below.

For example, in the case where the wireless communication apparatus lies near the base station, an electric field strength of the required signal becomes relatively high. In this case, a level of the reception signal which has passed through the attenuator 112, the amplifier 113, and the frequency conversion circuit 115 does not change.

However, in the receiving circuit as shown in FIG. 9, even if an electric field strength of the required signal is substantially high, the amplifier 113 amplifies the reception signal with a predetermined constant gain and current value. As a result, in the receiving circuit as shown in FIG. 9, even if there is no need to perform an amplification process due to a sufficiently high electric field strength, the amplifier 113 performs amplification using a constant gain and current, which results in unnecessary power consumption in the receiving circuit.

Also, in addition to the above-described two problems, in the receiving circuit as shown in FIG. 9, the reception sensitivity of the receiving circuit is lowered due to the variable attenuator 112 inserted between the antenna 111 and the amplifier 113.

As shown in FIG. 9, in the conventional receiving circuit, the variable attenuator 112 is positioned between the antenna 111 and the amplifier 113. In this case, a signal loss of up to about 0.5 dB occurs in the variable attenuator 112 due to an insertion loss of a part itself and a loss resulting from the insertion of a part in a signal transmission line. Such a signal loss will result in a low SNR (Signal Noise Ratio). Especially, it is rather difficult to compensate for low SNR caused in a circuit preceding the amplifier 113 by using a circuit subsequent to the amplifier 113. Such a problem will be described below in detail. In the following descriptions, the total NF (Noise Figure) (hereinafter, referred to as $NF_{total}$) of a plurality of circuits in a cascade arrangement is used as one example. NF represents the ratio of SNR of an input signal to SNR of an output signal. Specifically, NF is represented as the following equation:

$$NF=(S_{in}/N_{in})/(S_{out}/N_{out}).$$

In the above-described case, $NF_{total}$ is given by the following equation: $NF_{total}=NF1+(NF2-1)/G1+(NF3-1)/(G1*G2)+\ldots$ Note that NF1 represents an NF of a first stage circuit, and G1 represents a gain of the first stage circuit. Also, NF2 represents an NF of a second stage circuit, and G2 represents a gain of the second stage circuit. Still further, NF3 represents an NF of a third stage circuit, and G2 represents a gain of the third stage circuit.

Here, assuming that the total NF of a circuit in which no loss occurs in a previous stage of the amplifier is $NF_{total1}$, the following equation is established.

$$NF_{total1}=NF1+(NF2-1)/G1+(NF3-1)/(G1*G2)+$$

On the other hand, assuming that the total NF of a circuit in which a loss occurs in a previous stage of the amplifier is $NF_{total2}$, the following equation is established. Note that NF0 represents an NF of the previous stage circuit of the amplifier, and G0 represents a gain of the previous stage circuit of the amplifier.

$$NF_{total2}=NF0+(NF1-1)/G0+(NF2-1)/(G0*G1)+(NF3-1)/(G0*G1*G2)+$$

Here, assume that a loss in the previous stage of the amplifier is 0.5 dB. In this case, NF0=0.5 dB, and G0=−0.5 dB. Thus, in the circuit in which a loss occurs in the previous circuit of the amplifier, not only NF0 is added but also a term NF1 is incremented since G0 is equal to or smaller than 1, which results in low $NF_{total2}$. Even if an NF in a subsequent circuit is improved in order to prevent $NF_{total2}$ from being lowered, the improvement effect of $NF_{total2}$ of the entire circuit substantially reduces since the improved NF is multiplied by 1/(G0*G1).

As such, a loss in a previous stage of the amplifier 113 results in a low SNR, and it is difficult to compensate for such a low SNR in a subsequent stage of the amplifier 113. As a result, the reception sensitivity of the wireless communication apparatus is substantially lowered.

SUMMARY OF THE INVENTION

Therefore, an object of the present invention is to provide a receiving circuit of a wireless communication apparatus in which a frequency conversion circuit does not operate in the saturation region.

Also, another object of the present invention is to provide a receiving circuit of a wireless communication apparatus, the receiving circuit being capable of reducing power consumption.

Also, still another object of the present invention is to provide a receiving circuit of a wireless communication apparatus, the receiving circuit being capable of preventing a loss from occurring in a reception signal in a previous stage of an amplifier.

The present invention has the following features to attain the object mentioned above.

In a receiving circuit according to the present invention, an antenna receives a high-frequency signal at a predetermined frequency band, a level changing section changes a signal level of the high-frequency signal received by the antenna, a subsequent-stage circuit performs predetermined signal processing for the high-frequency signal whose signal level is changed at the level changing section, a detecting section detects a signal level of the high-frequency signal for which the signal processing is performed by the subsequent-stage circuit, and a control section sets a rate of change of the high-frequency signal, based on the signal level of the high-frequency signal detected by the detecting section, so that the signal level of the high-frequency signal detected by the detecting section does not exceed a predetermined value.

Preferably, the level changing section is an amplifier, and the control section sets a gain of the level changing section to a gain smaller than a predetermined value when the signal level of the high-frequency signal detected by the detecting section is greater than a predetermined threshold, and the control section sets a gain of the level changing section to the predetermined value when the signal level of the high-frequency signal detected by the detecting section is smaller than the threshold value.

The control section may generate a control signal smaller than a predetermined level when the signal level of the high-frequency signal detected by the detecting section is greater than a predetermined threshold value, and the control section may generate a control signal having the predetermined level when the signal level of the high-frequency signal detected by the detecting section is smaller than the threshold value. The amplifier may include: a grounded-emitter amplifying transistor; a bias circuit for applying a bias voltage to a base of the amplifying transistor; a control transistor connected to the amplifying transistor in cascode connection; and an output circuit connected to a collector of the control transistor. The amplifying transistor may amplify the high-frequency signal that is inputted to the base and to which the bias voltage is applied. The control transistor may control a gain of the amplifying transistor so as to become a gain based on the control signal that is generated at the control section and is inputted to the base. The output circuit may output the amplified high-frequency signal from the collector of the control transistor.

Also, the detecting section may include: a level detecting transistor with an emitter to which the high-frequency signal, which is outputted from the subsequent-stage circuit, is inputted; a bias circuit for applying a predetermined bias voltage to a base of the level detecting transistor; and an output circuit for converting a high-frequency signal, which is outputted from a collector of the level detecting transistor, to a direct current. The level detecting transistor may output, from the collector, a high-frequency signal that is inputted to the emitter and whose signal level is greater than a threshold value determined by the predetermined bias voltage. The control section may generate a control signal smaller than a predetermined level when the direct current outputted from the output circuit is greater than a predetermined value, and the control section may generate a control signal having the predetermined level when the direct current outputted from the output circuit is smaller than the threshold value.

Also, the receiving circuit may further comprise: a frequency conversion circuit for converting a frequency of the high-frequency signal outputted from the subsequent-stage circuit to a frequency lower than the frequency of the high-frequency signal; and a bias circuit connected to an input section of the frequency conversion circuit. The detecting section may detect a consumption current of the bias circuit.

Preferably, the subsequent-stage circuit is a bandlimiting filter for outputting, from among the high-frequency signals outputted from the level changing section, only a signal within the predetermined frequency band to the detecting section.

Preferably, the bandlimiting filter has frequency characteristics not allowing a transmission signal, which is outputted from a transmission circuit in the wireless communication apparatus, to be outputted to the detecting section.

As such, based on the receiving circuit according to the present invention, the control section controls a rate of change in the level changing section so that a signal level of the high-frequency signal does not exceed a predetermined value. Thus, it is possible to prevent a signal whose signal level is greater than a dynamic range of a circuit connected to a subsequent stage of the receiving circuit from being inputted to the circuit. As a result, it is possible to improve a reception performance of the wireless communication apparatus to which the receiving circuit is applied.

Also, the level changing section is an amplifier. Further, the control section sets a gain of the level changing section to a gain smaller than a predetermined value when a signal level of the high-frequency signal detected by the detecting section is greater than a predetermined threshold value, and the control section sets a gain of the level changing section to the predetermined value when a signal level of the high-frequency signal detected by the detecting section is smaller than the threshold value. Thus, when a high-frequency signal having a high signal level is inputted, the amplifier operates at a lower gain. As a result, it is possible to prevent a signal whose signal level is greater than a dynamic range of a circuit connected to a subsequent stage of the receiving circuit from being inputted to the subsequent-stage circuit.

Also, the amplifier is composed of an amplifying transistor and a control transistor, and the control transistor controls a gain and a current of the amplifying transistor. As such, the control transistor is used for controlling a gain and a current of the amplifying transistor, whereby it is possible to control a gain of the amplifying transistor even if a high-frequency signal having a higher signal level is inputted. Also, it is possible to reduce the power consumption of the entirety of the receiving circuit since a value of a current flowing through the amplifying transistor can be reduced.

Also, the level detecting transistor is set so as not to operate when an AGC operation is not performed, whereby it is possible to prevent reception characteristics of the receiving circuit from being deteriorated.

Also, the circuits and the elements are not directly connected to a signal transmission line, whereby it is possible to prevent reception characteristics from being deteriorated when an AGC operation is not performed.

Also, a signal in a predetermined frequency band is outputted to the detecting section, whereby a disturbing signal as well as a required signal included in the predetermined frequency band is outputted to the detecting section. As a result, in the case where a signal level of the disturbing signal is greater than that of the required signal, the detecting section detects a signal level of the high-frequency signal including the signal level of the disturbing signal. Thus, the control section controls the level changing section based on the signal level of the above high-frequency signal. That is, even if a disturbing signal having a substantially high signal level is received, it is possible to prevent a signal level of a received high-frequency signal from exceeding a dynamic range in the receiving circuit.

Also, the bandlimiting filter has frequency characteristics not allowing a transmission signal, which is outputted from a transmission circuit in the wireless communication apparatus, to be outputted to the detecting section. Thus, it is possible to prevent an AGC operation from being performed for a transmission signal leaking from the transmission circuit to the reception circuit.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3B is an illustration showing a relationship among an output voltage Va of a bias circuit 61, a level of an input signal inputted to an emitter at the moment when an amplitude of the input signal exceeds a dynamic range of a frequency conversion circuit 15, and a base-emitter voltage Vbe when a transistor 64 is turned ON;

DESCRIPTION OF THE PREFERRED EMBODIMENTS

Figure 1:
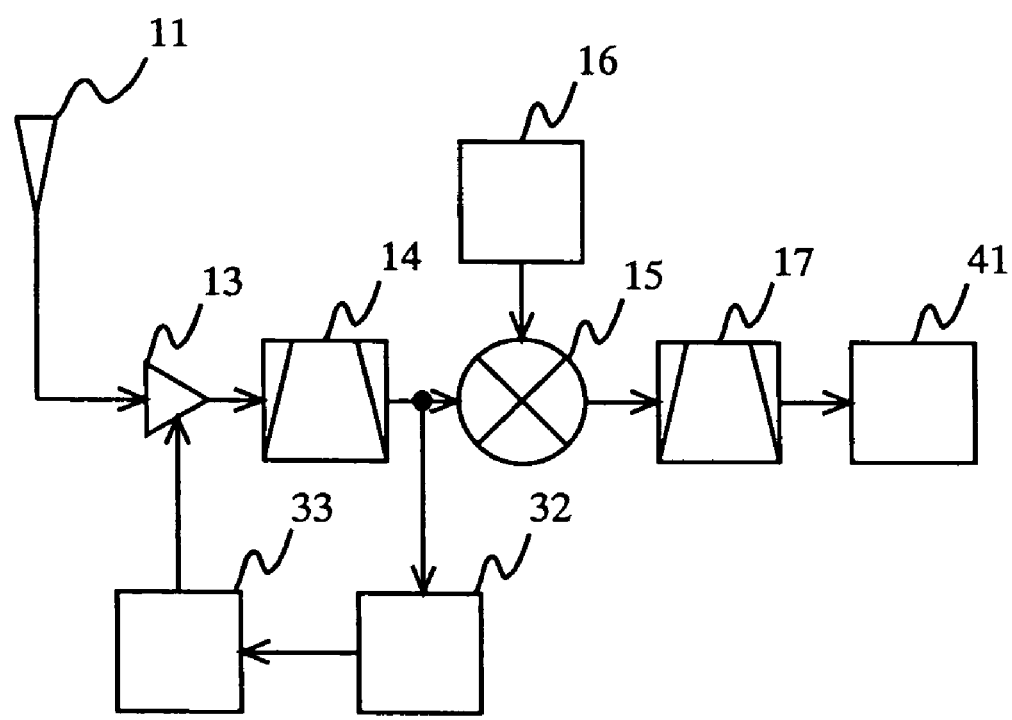
FIG. 1 is a block diagram showing a structure of a receiving circuit according to one embodiment of the present invention.

Hereinafter, with reference to the drawing, a receiving circuit of a wireless communication apparatus according to one embodiment of the present invention will be described. FIG. 1 is a block diagram showing a structure of the receiving circuit of the wireless communication apparatus according to the present embodiment.

The receiving circuit as shown in FIG. 1 includes an antenna 11, an amplifier 13, a bandlimiting filter 14, a frequency conversion circuit 15, a local oscillator 16, a bandlimiting filter 17, a level detecting circuit 32, a level control circuit 33, and a signal processing circuit 41.

The antenna 11 receives a plurality of high-frequency signals transmitted from a base station (not shown). The amplifier 13 amplifies the high-frequency signals received by the antenna 11 in accordance with control of the level control circuit 33. The bandlimiting filter 14 outputs, from among the high-frequency signals received by the antenna 11, only a high-frequency signal in a frequency range which can be processed by the wireless communication apparatus to the frequency conversion circuit 15 and the level detecting circuit 32. The local oscillator 16 generates a signal at a predetermined frequency. The frequency conversion circuit 15 converts the high-frequency signal outputted from the bandlimiting filter 14 to an intermediate frequency signal using the signal at a predetermined frequency generated by the local oscillator 16 (a so-called superheterodyne system).

The bandlimiting filter 17 outputs, from among the intermediate frequency signals outputted from the frequency conversion circuit 15, only an intermediate frequency signal within a predetermined frequency to the signal processing circuit 41. The signal processing circuit 41 performs various types of signal processing for the intermediate frequency signal outputted from the bandlimiting filter 17.

Here, the level detecting circuit 32 and the level control circuit 33, which are features of the receiving circuit according to the present embodiment, will be described. The level detecting circuit 32 according to the present embodiment detects a signal level of a reception signal based on an output from the bandlimiting filter 14. In the case where a signal level of the reception signal is greater than a predetermined level, the level detecting circuit 32 generates a direct current whose magnitude corresponds to the signal level of the reception signal. The level control circuit 33 converts the inputted direct current to a control signal having a signal level suitable for control of an operation of the amplifier 13. Specifically, the level control circuit 33 generates a control signal so that a signal level of the control signal becomes minimum in the case of a maximum direct current, and a signal level of the control signal becomes maximum in the case of a minimum direct current. In other words, the level control circuit 33 inverts the maximum and minimum values of a direct current to generate a control signal. Note that, in the case where a direct current is not outputted, the level control circuit 33 outputs a control signal having the maximum signal level. Then, the amplifier 13 amplifies the reception signal by a gain depending on a signal level of the control signal inputted from the level control circuit 33.

As such, in the case where a reception signal whose intensity level is smaller than a predetermined level is inputted, the level detecting circuit 32 and the level control circuit 33 cause the amplifier 13 to operate by a predetermined constant gain. On the other hand, in the case where a reception signal whose intensity level is greater than a predetermined level is inputted, the level detecting circuit 32 and the level control circuit 33 cause the amplifier 13 to operate by a gain smaller than the predetermined constant gain. As a result, feedback control is performed for an operation of the amplifier 13, whereby it is possible to prevent a peak value of a reception signal detected by the level detecting circuit 32 from being equal to or greater than a predetermined intensity level. As a result, it is possible to prevent a reception signal having a substantially high signal level from being inputted to the frequency conversion circuit 15, and prevent the frequency conversion circuit 15 from operating in the saturation region. In other words, crossmodulation and intermodulation, which are substantially increased by a saturated operation, are minimized, thereby preventing a reception performance of the wireless communication apparatus from being deteriorated.

Figure 2:
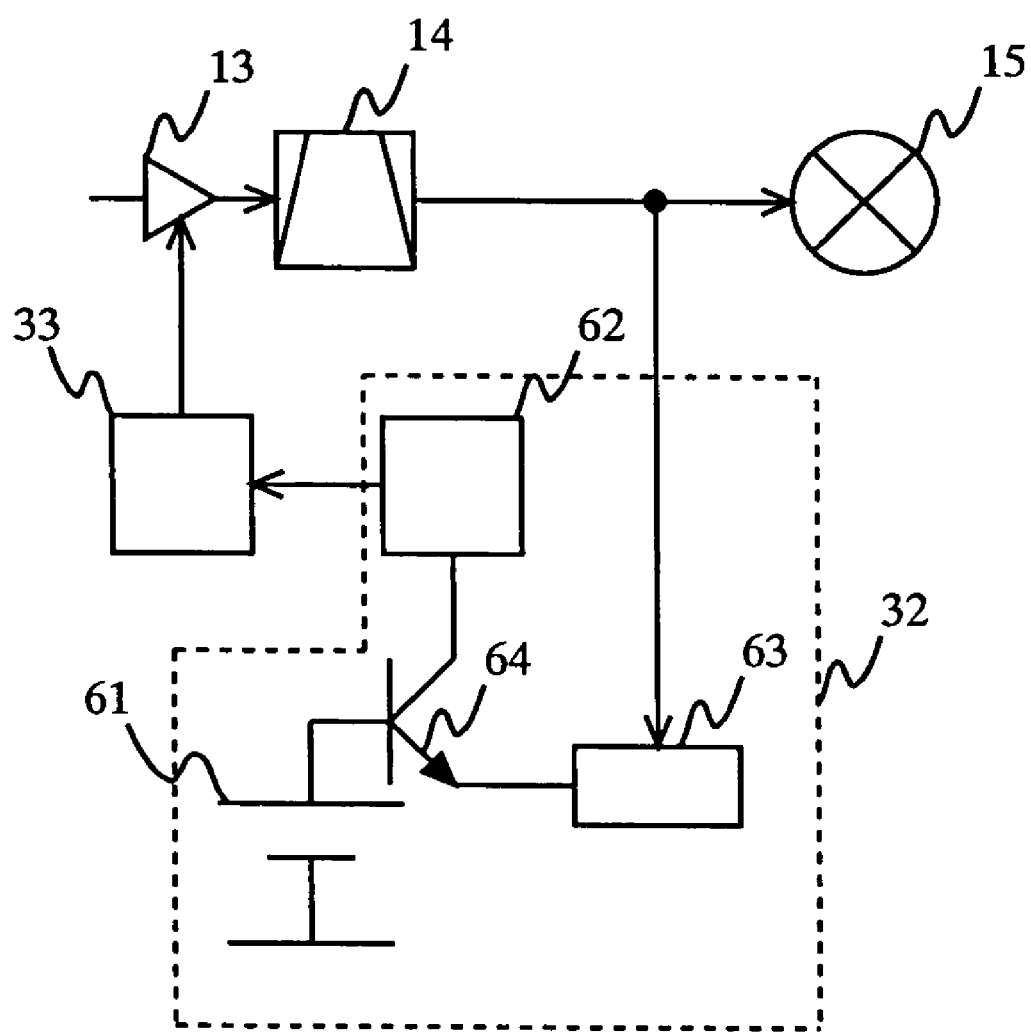
FIG. 2 is an illustration showing an exemplary structure of a level detecting circuit.

Hereinafter, with reference to the drawing, detailed structures of the level detecting circuit 32 and the level control circuit 33 will be described. Here, FIG. 2 is an illustration showing an exemplary detailed structure of the level control circuit 33.

The level detecting circuit 32 includes a bias circuit 61, an output circuit 62, an impedance element 63, and a transistor 64. The impedance element 63 is connected to a signal line branched off the bandlimiting filter 14. Further, an emitter of the transistor 64 is connected to the other end of the impedance element 63. Also, a positive pole of the bias circuit 61 is connected to a base of the transistor 64. On the other hand, a negative pole of the bias circuit 61 is grounded. Also, a collector of the transistor 64 is connected to the output circuit 62, and an output of the output circuit 62 is connected to the level control circuit 33.

Note that a voltage of the bias circuit 61 is Va, and a base-emitter voltage is Vbe when the transistor 64 is turned ON.

An operation of the above-described level control circuit 33 will be described.

A signal passing through the bandlimiting filter 14 is divided into two signals. One signal is inputted to the frequency conversion circuit 15, and the other signal is inputted to the emitter of the transistor 64 after passing through the impedance element 63 with a specific impedance.

Figure 3A:
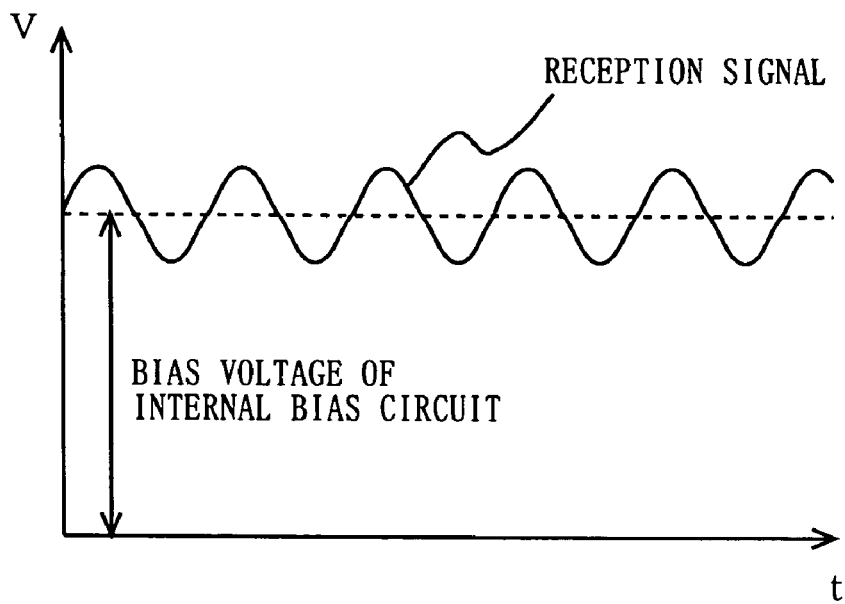
FIG. 3A is an illustration showing a waveform of a signal inputted to an impedance element 63.

Here, an input to the frequency conversion circuit 15 is clamped to a voltage determined by an internal bias circuit. Thus, a signal outputted from the bandlimiting filter (that is, a signal to be inputted to the frequency conversion circuit 15 and the impedance element 63) is superimposed on a bias voltage of the internal bias circuit of the frequency conversion circuit 15. Such a signal has a waveform as shown in FIG. 3A. Note that FIG. 3A is an illustration showing a waveform of a signal inputted to the impedance element 63. Specifically, a vertical axis represents a potential, and a horizontal axis represents a time.

Figure 3B:
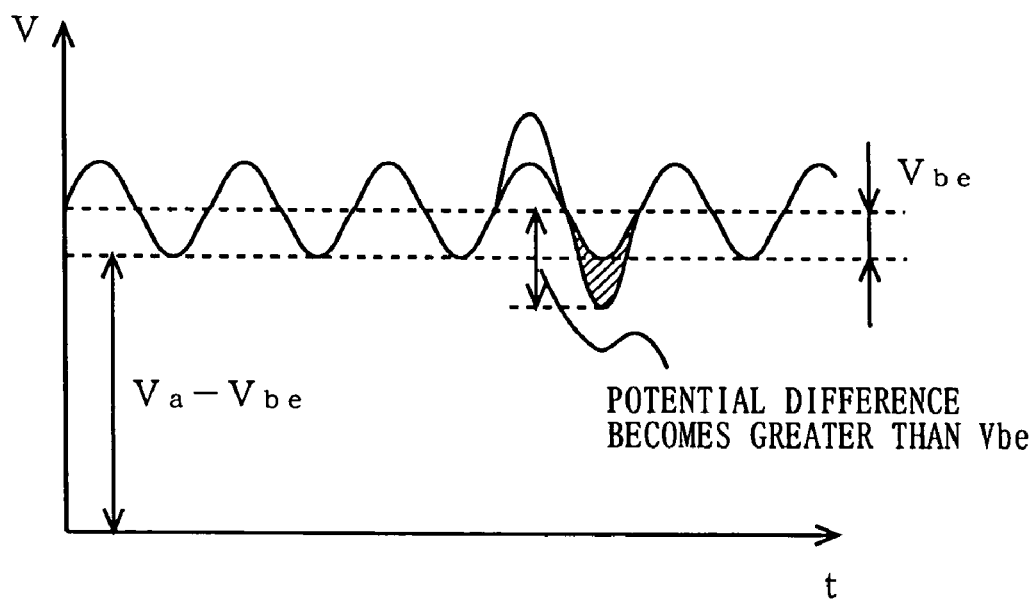

Also, the output voltage Va of the bias circuit 61 is applied to a base of the detecting transistor 64. An input level to be detected can be set using the output voltage Va of the bias circuit 61. Specifically, the output voltage of the bias circuit 61 is determined so as to be higher than a lower limit of signal amplitude corresponding to an electric field strength desired to be detected. The electric field strength is superimposed on the output voltage of the internal bias circuit of the frequency conversion circuit 15 by a voltage Vbe at which the transistor 64 is turned ON. Thus, in the case where a signal whose amplitude is greater than the signal amplitude corresponding to the electric field strength desired to be detected (that is, an electric field strength exceeding a dynamic range of the frequency conversion circuit 15) is inputted to the transistor 64, the transistor 64 is turned ON, and a collector current flows through the output circuit, which will be described in detail using the drawing. FIG. 3B is an illustration showing a relationship among an output voltage Va of the bias circuit 61, a level of an input signal inputted to an emitter at the moment when an amplitude of the input signal exceeds a dynamic range of the frequency conversion circuit 15, and a base-emitter voltage Vbe when the transistor 64 is turned ON. Note that a vertical axis represents potential, and a horizontal axis represents a time.

First, the output voltage Va of the bias circuit 61 is set so that a potential located at the bottom of the amplitude of the input signal, whose electric field strength just exceeds the dynamic range of the frequency conversion circuit 15, coincides with Va-Vbe. In this case, the base-emitted voltage should be Vbe in order to turn the transistor 64 ON. That is, a potential of the emitter should be equal to or smaller than Va-Vbe.

Here, in the case where an amplitude of the inputted signal is smaller than the amplitude of the signal as shown in FIG. 3B, a potential of the emitter of the transistor 64 does not become lower than Va-Vbe. As a result, the transistor 64 is not turned ON, and the collector current does not flow.

On the other hand, in the case where an amplitude of the inputted signal is greater than an amplitude just exceeding the dynamic range of the frequency conversion circuit 15, a potential of the emitter of the transistor 64 becomes lower than Va-Vbe. That is, a base-emitter voltage becomes greater than Vbe, and the transistor 64 is turned ON. As a result, during a time period represented as a shaded area in FIG. 3B, a collector current with a magnitude depending on the amplitude of the signal flows through the output circuit 62.

The output circuit 62 rectifies the collector current to a direct signal corresponding to the magnitude of the collector current, and outputs the direct signal to the level control circuit 33. Next, the level control circuit 33 converts the inputted direct signal to a control signal having a direct current value suitable for control of an operation of the amplifier 13. Specifically, the level control circuit 33 generates a control signal so that a signal level of the control signal becomes minimum in the case of a maximum direct current, and a signal level of the control signal becomes maximum in the case of a minimum direct current. Then, the control signal is inputted to the amplifier 13.

Figure 4:
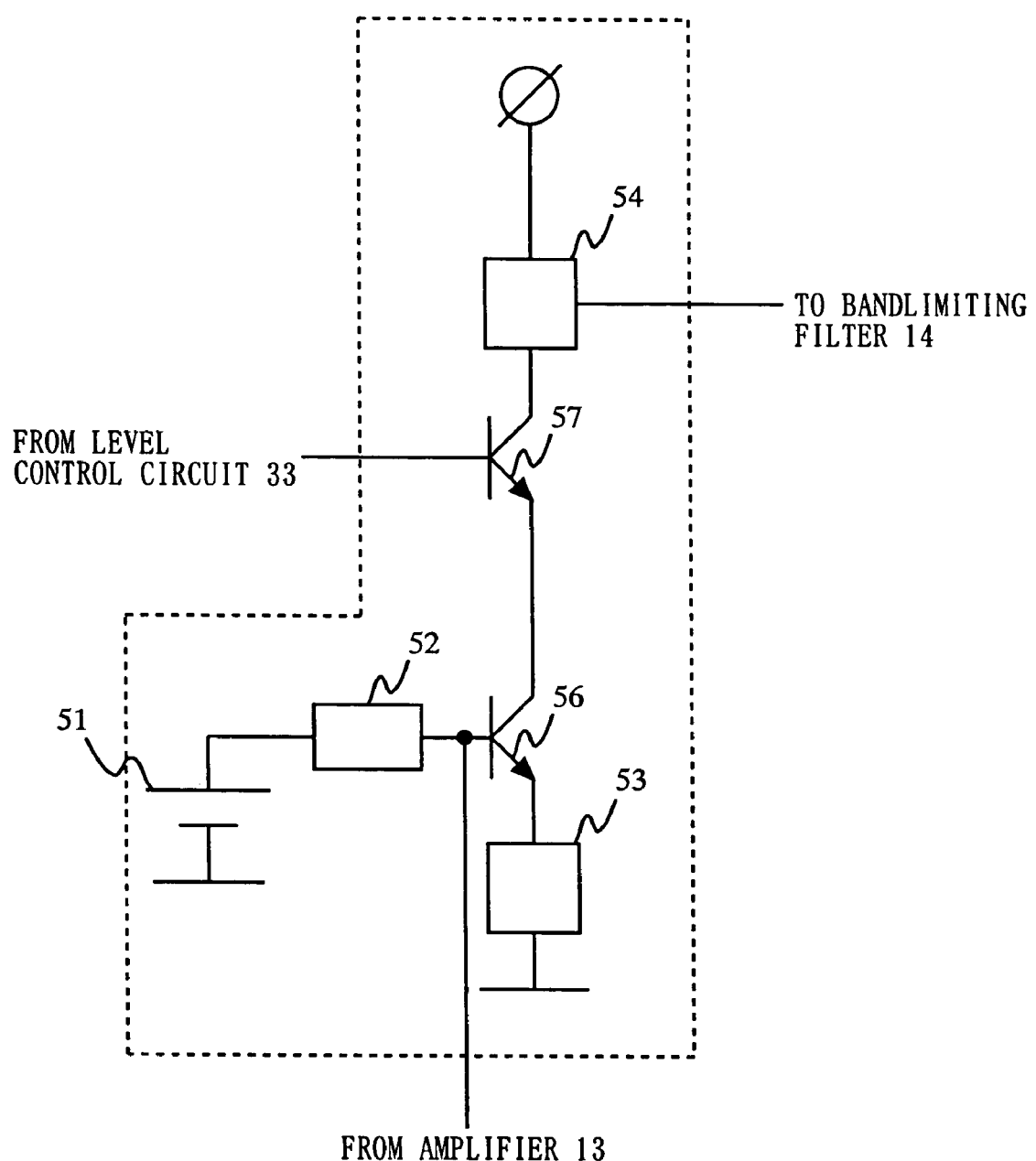
FIG. 4 is an illustration showing an exemplary structure of an amplifier.

Next, with reference to the drawing, a specific circuit of the amplifier 13, which is to be controlled, will be described. FIG. 4 is an illustration showing a specific circuit structure of the amplifier 13.

A reception signal is inputted to a base of a transistor 56. Note that a base of the transistor 56 is connected to a bias circuit 51 via an impedance element 52 with a specific impedance for driving the transistor 56. An emitter of the amplifying transistor 56 is grounded via an impedance element 53 with a specific impedance. A collector of the transistor 56 shares a common connection with the emitter of the transistor 57. That is, the transistor 56 and the transistor 57 are connected to each other in so-called cascode connection. Also, a signal outputted from the collector of the transistor 57 is outputted to the bandlimiting filter 14 via the output circuit 54. Note that the output circuit 54 is realized by a coil or a resistor, for example. A control signal outputted from the level control circuit 33 is inputted to the base of the transistor 57. Also, a constant pressure power source is connected to the output circuit 54.

In the above-described amplifier 13, a current flows from the constant pressure power source toward a ground located under the emitter of the transistor 56. Then, the transistor 56 amplifies an input signal inputted to the base, and the transistor 57 controls a gain of the transistor 56 in accordance with a level of the control signal from the level control circuit 33. As a result, a signal level of the amplified input signal is outputted from the output circuit 54. Hereinafter, a specific operation of the amplifier 13 will be described. First, a normal operation will be described. Here, "a normal operation" means an operation performed by the amplifier 13 in the case where an intensity of a signal received by the antenna 11 does not exceed a dynamic range of the frequency conversion circuit 15.

First, an output voltage (a base voltage of the transistor 57) from the level control circuit 33 is set to an appropriate value so that the transistor 56, the transistor 57, and the output circuit 54 do not operate in the saturation region. A reception signal is amplified by the transistor 56, and is inputted to the emitter of the transistor 57. Then, the signal outputted from the collector of the transistor 57 is outputted to the bandlimiting filter 14 after passing through the output circuit 62. That is, the amplifier 13 amplifies the signal outputted from the antenna 11 by a predetermined gain, and outputs the amplified signal to the bandlimiting filter 14.

Next, an operation performed by the amplifier 13 in the case where a level of a signal received by the antenna 11 exceeds a dynamic range of the frequency conversion circuit 15 will be described.

First, in the case where a signal whose signal level exceeds the dynamic range of the frequency conversion circuit 15 is received by the antenna 11, a potential of the control signal outputted from the level control circuit 33 becomes lower than that of the normal operation. A potential of the collector of the transistor 56 is reduced when the potential of the control signal outputted from the level control circuit 33 is reduced, and the amplifying transistor 56 starts to operate in the saturation region. When the saturated operation is started, a current amplification factor ($h_{FE}=I_c/I_b$) is reduced, and a level of the signal outputted from the collector of the transistor 56 is lowered, whereby a gain is reduced. Also, a base current of the transistor 56 is increased due to the saturated operation, which creates a large voltage drop in the impedance element 53 and reduces the base potential. As a result, a current flowing through the emitter is reduced. That is, a current flowing through the transistor 56 and a gain are reduced at the same time. As such, based on the amplifier 13 according to the present embodiment, it is possible to control a gain and a current of the transistor 56 by controlling a base potential of the transistor 57.

Note that, in the case where a reception signal whose level is greater than a threshold value is inputted to the amplifier 13, the circuit as shown in FIG. 4 may be replaced with a circuit for reducing an output voltage of the bias circuit 51 in order to reduce a gain and a current at the same time. However, such a circuit has a disadvantage in that an upper limit of a level of a reception signal whose gain and current can be reduced is restricted, which will be described in detail below with reference to FIG. 5.

Figure 5:
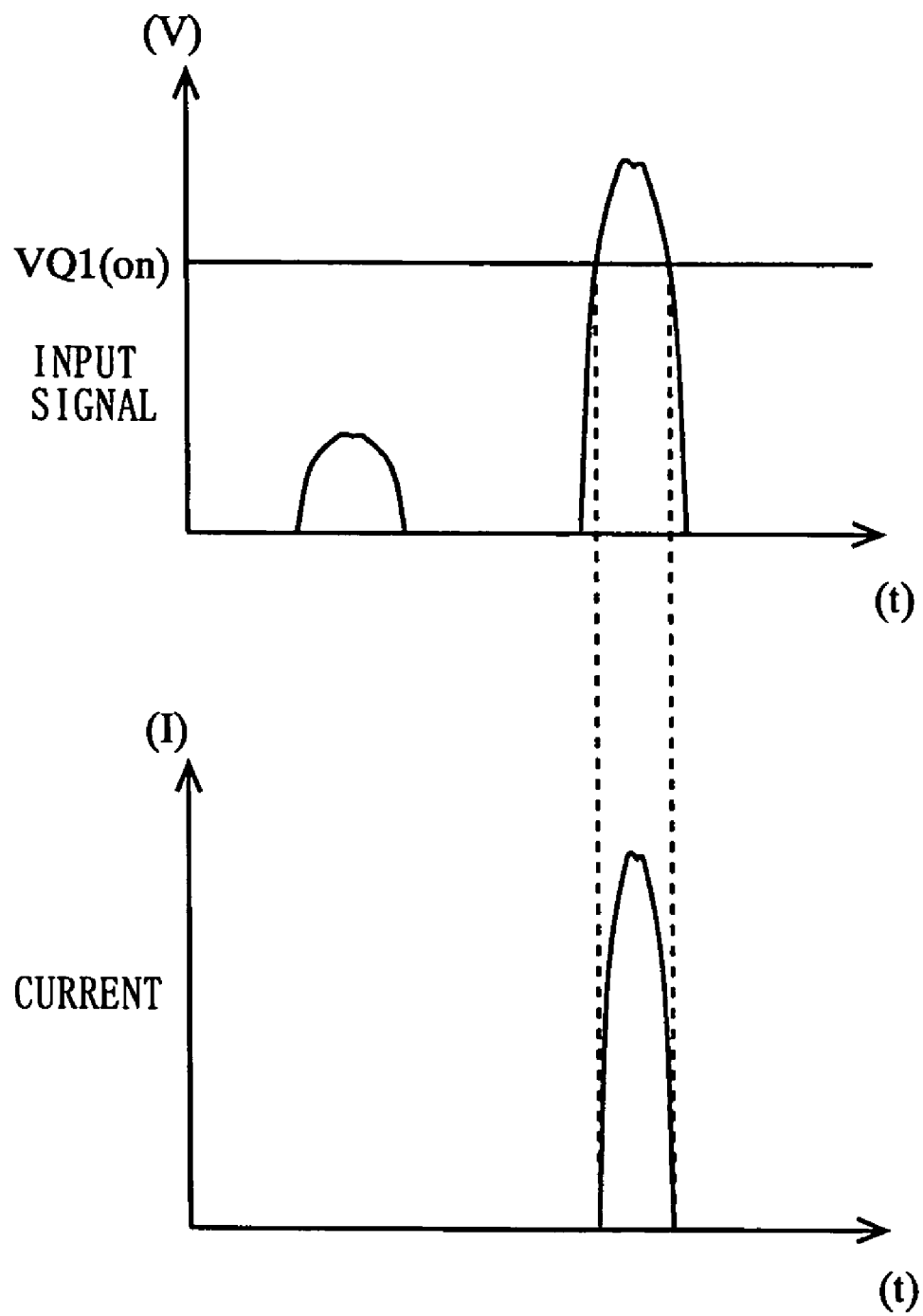
FIG. 5 is an illustration showing a signal level of an input signal inputted to the amplifier, and a current value of an amplified signal.

As described above, in the case where a reception signal whose level is greater than a threshold value is inputted to the amplifier 13, a gain of the transistor 56 is reduced by reducing the output voltage of the bias circuit 51. In the case where an output voltage of the bias circuit 51 is reduced by such a method, the output voltage of the bias circuit 51 is 0V. In this case, as shown in FIG. 5, in the case where a signal exceeding a voltage VQ1 (on), at which the amplifying transistor 56 operates, is inputted to the base of the transistor 56, the amplifying transistor 56 operates during a time period when the signal exceeding a voltage VQ1 is inputted, and outputs an amplified signal to a subsequent-stage circuit. If a level of the inputted signal is further increased, it is impossible to perform gain control, whereby a current is consumed at the time of outputting a signal corresponding to the increased signal level.

As described above, based on the receiving circuit according to the present embodiment, feedback control is performed for the amplifier 13 based on an output from the bandlimiting filter 14. A signal outputted from the bandlimiting filter 14 includes a disturbing signal as well as a required signal. Thus, in the case where a disturbing signal whose signal level is greater than a required signal is inputted, the receiving circuit is able to detect a signal level in which a level of the disturbing signal and a level of the required signal are combined, and perform AGC based on the detected signal level. As a result, unlike the conventional receiving circuit, there is not such a problem that AGC is not performed since a signal level of the disturbing signal is not detected in the case where a disturbing signal that is greater than a required signal is inputted. That is, it is possible to prevent a signal that is substantially greater than a dynamic range from being inputted to the frequency conversion circuit 15. As a result, it is possible to improve a reception performance of the receiving circuit.

Also, based on the receiving circuit according to the present embodiment, it is possible to minimize power consumption of the receiving circuit. In the conventional receiving circuit, even if a signal having a substantially high signal level is received, the amplifier 13 amplifies the received signal by a constant gain and current. On the other hand, based on the receiving circuit according to the present embodiment, in the case where a signal having a substantially high signal level is received, the amplifier 13 amplifies the received signal so as to have an appropriate intensity by reducing a gain and a current. That is, based on the receiving circuit according to the present embodiment, it is possible to reduce a value of a current flowing through the amplifier 13, thereby minimizing power consumption of the receiving circuit.

Also, based on the receiving circuit according to the present embodiment, a variable attenuator is not provided between the antenna 11 and the amplifier 13, thereby preventing a loss caused due to the presence of the variable attenuator.

Also, based on the receiving circuit according to the present embodiment, it is possible to minimize influences on high-frequency characteristics, especially on noise characteristics defining the reception sensitivity since the detecting transistor 64 cuts off in the weak electric field area.

Note that, based on the receiving circuit according to the present embodiment, it is assumed that a control signal controls a gain of the amplifier 13, but it is not limited thereto. Alternatively, the control signal may control the amount of attenuation of a variable attenuator additionally provided between the amplifier 13 and the antenna 11. In this case, however, it is impossible to solve the problem of insertion loss of the variable attenuator in the case where the attenuation amount of the variable attenuator is controlled.

Figure 6:
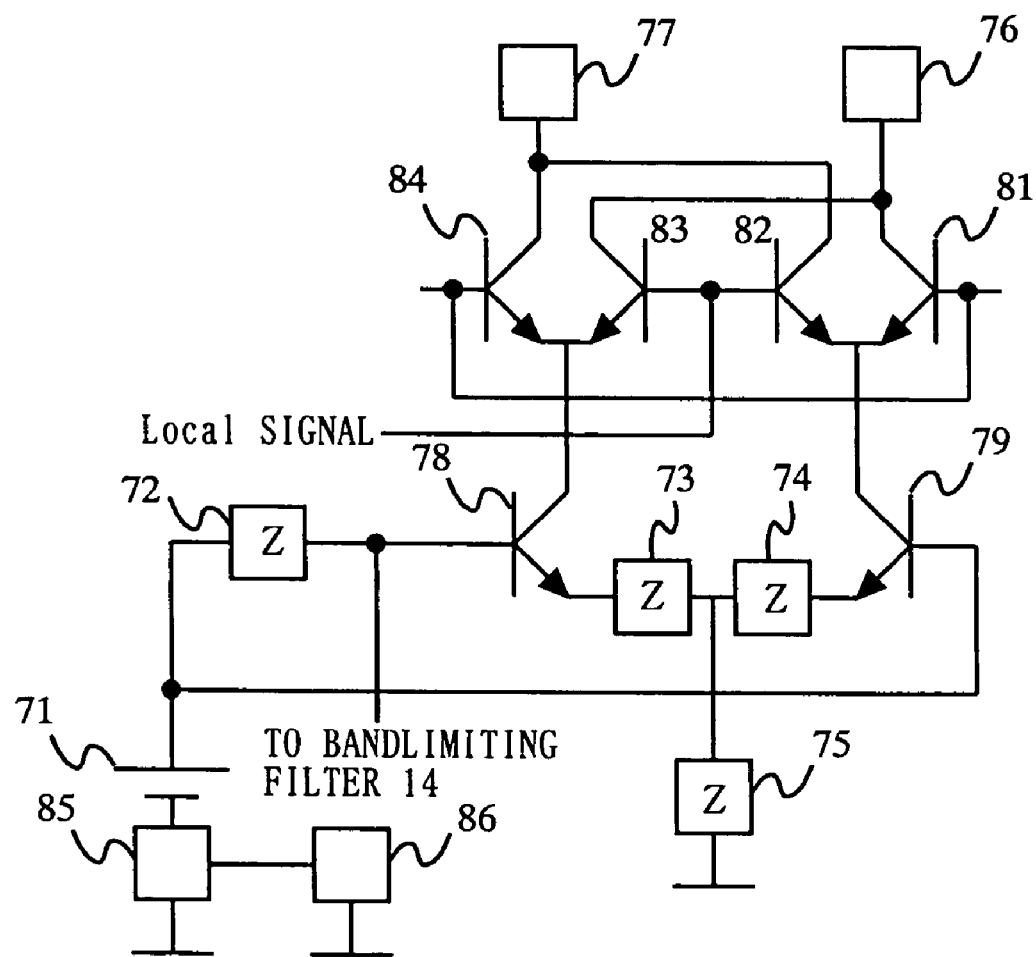
FIG. 6 is an illustration showing another exemplary structure of the level detecting circuit.

Note that, in the present embodiment, it is assumed that the level detecting circuit 32 has the structure as shown in FIG. 2, but it is not limited thereto. Hereinafter, another exemplary structure of the level detecting circuit 32 will be described with reference to the drawing. Here, FIG. 6 is an illustration showing another exemplary structure of the level detecting circuit 32.

The level detecting circuit 32 includes a pair of transistors 78 and 79 composing a differential amplifier, a pair of transistors 83 and 84 whose emitters share a common connection with a collector of the transistor 78, an impedance element 73 with a specific impedance, the impedance element 73 connected to an emitter of the transistor 78, an impedance element 74 with a specific impedance, the impedance element 74 connected to an emitter of the transistor 79, an output circuit 76 sharing a common connection with collectors of the transistors 81 and 83, an output circuit 77 sharing a common connection with collectors of the transistors 82 and 84, an impedance element 75 with a specific impedance, the impedance element 75 sharing a common connection with the impedance elements 73 and 74 each having a specific impedance, an impedance element 72 with a specific impedance, the impedance element 72 connected to a base of the transistor 78, a bias circuit 71 sharing a common connection with the impedance element 72 with a specific impedance and a base of the transistor 79, and a level detecting circuit 85 connected to the bias circuit 71.

Here, the impedance element 75 with a specific impedance is grounded. Also, bases of the transistors 82 and 83 share a common connection with bases of the transistors 81 and 84, and a local signal is inputted to the above bases.

A reception signal is inputted to the base of the transistor 78, and an output signal is extracted from the collectors of the transistors 78 and 79. The output signal is inputted to the emitters of the transistors 81 and 82 and the emitters of the transistors 83 and 84, and frequency conversion is performed for the resultant signal by the local signal inputted to the bases of the transistors 81 and 84 and the bases of the transistors 82 and 83. The frequency-converted signal is inputted to the output circuits 76 and 77, and is extracted.

Figure 7:
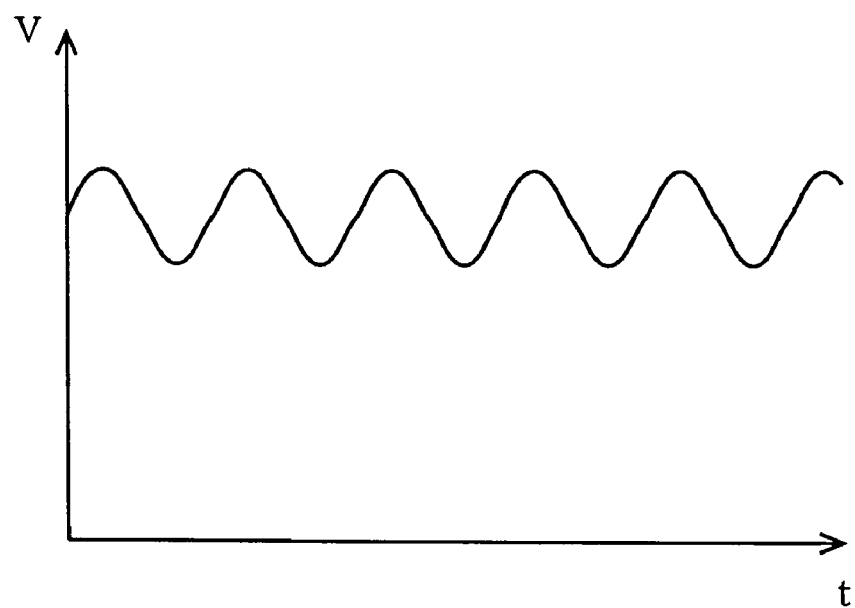
FIG. 7 is an illustration showing a waveform of a base voltage of a transistor 78, and a waveform of a current flowing through a bias circuit 71.
Figure 7:
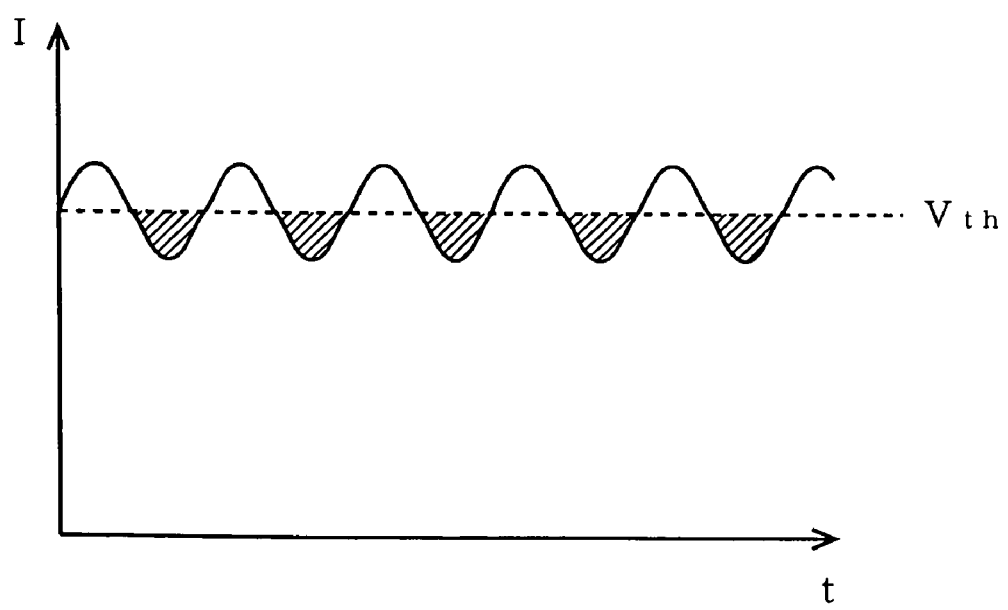
Figure 8:
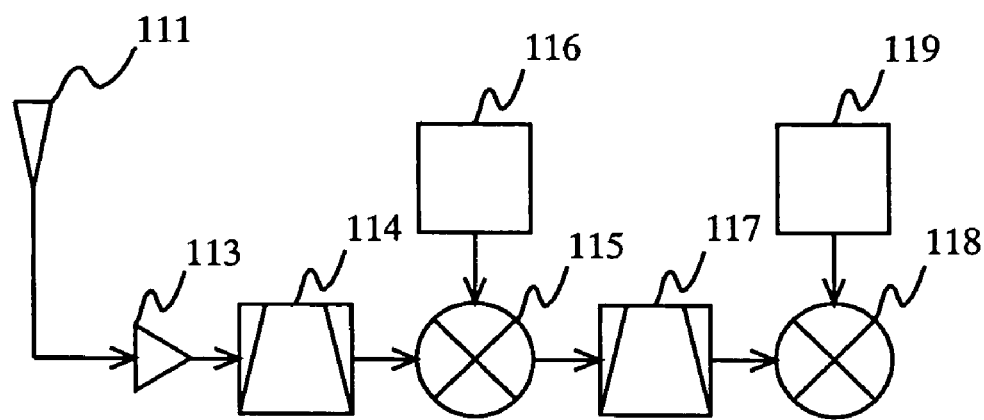
FIG. 8 is a block diagram showing a structure of a conventional receiving circuit.
Figure 9:
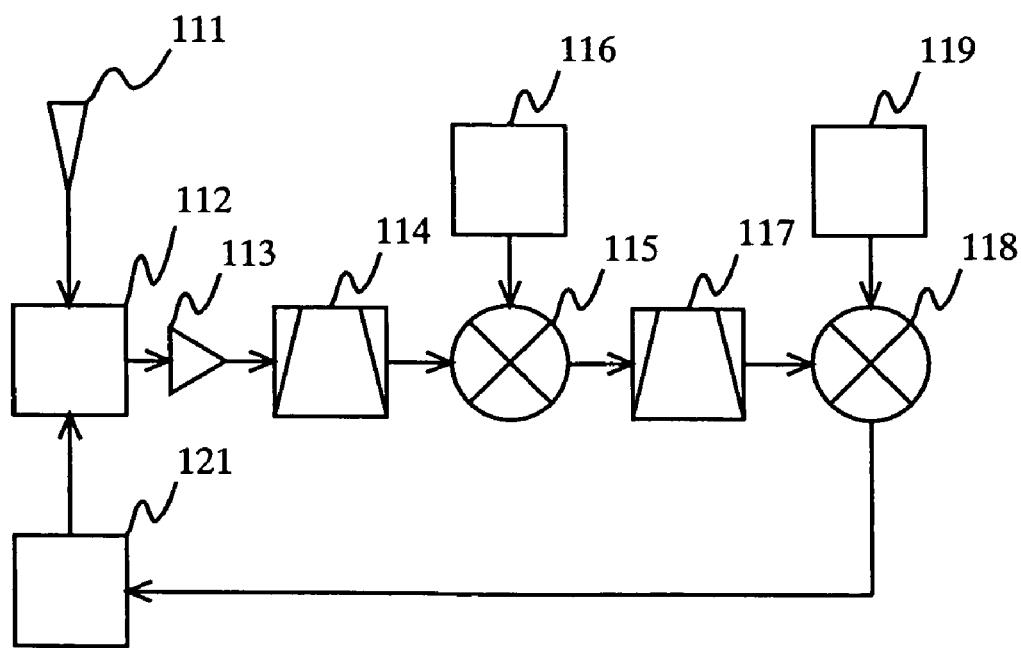
FIG. 9 is a block diagram showing a structure of another conventional receiving circuit.
Figure 10:
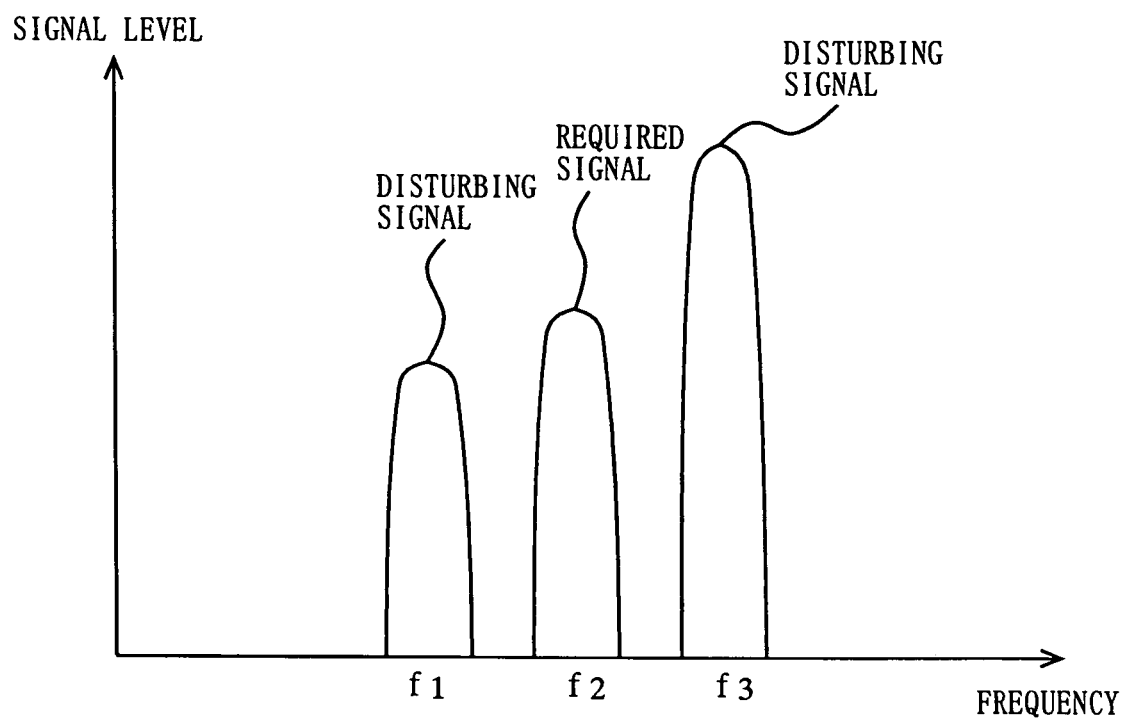
FIG. 10 is an illustration showing a high-frequency signal including a disturbing signal.

Here, FIG. 7 is an illustration showing a waveform of a base voltage of the transistor 78 and a waveform of a current flowing through the bias circuit 71. The current flowing through the bias circuit 71 is converted from a base voltage waveform of the transistor 78 by the impedance element 72 with a specific impedance. Here, the level detecting circuit 85 compares a current value of the bias circuit 71 and a threshold value (Vth) determined therein, and outputs a signal component below the threshold value (Vth) to the gain control circuit 86. The gain control circuit 86 converts the inputted signal component to a direct current depending on a level of the input signal, and outputs the direct current. An output signal of the gain control circuit 86 is used as a gain control signal of an amplifier including a gain control section, thereby constructing an AGC loop.

The structure of the level detecting circuit as shown in FIG. 6 prevents the level detecting circuit and the elements from being directly connected to a signal transmission line in the case of performing an AGC operation, whereby it is possible to prevent characteristics from being deteriorated by circuit insertion loss and parasitic elements. Note that the level detecting circuit 85 of the present embodiment may output a signal component exceeding a threshold value, in place of a signal component below the threshold value.

Note that it is possible to improve the reception sensitivity of the receiving circuit by changing settings so that a passband of the bandlimiting filter 14 does not include a transmission signal frequency band. Such a method for improving the reception sensitivity will be described in detail below.

In recent years, the number of mobile phones capable of concurrently performing data transmission and reception has increased. In the case where data transmission and reception are concurrently performed, a substantially large transmission signal is leaked from a transmission end to a reception end. As a result, an AGC operation is performed for the above transmission signal. In this case, even if there is no need to reduce a gain of the amplifier 13 due to a small reception signal, an AGC operation is performed when a transmission signal exceeding a signal level at which an AGC operation is performed is leaked from a transmission block, thereby making it impossible to receive a reception signal.

Thus, settings are changed so that a passband of the bandlimiting filter 14 does not include a transmission signal frequency band, thereby preventing an AGC operation from being performed for a transmission signal leaking from a transmission block to a reception block.

The receiving circuit according to the present invention is capable of preventing the frequency conversion circuit from operating in the saturation region, and is useful as a receiving circuit, etc., of a wireless communication apparatus.

While the invention has been described in detail, the foregoing description is in all aspects illustrative and not restrictive. It is understood that numerous other modifications and variations can be devised without departing from the scope of the invention.

What is claimed is:

1. A receiving circuit for a radio communication apparatus, comprising:
    an antenna for receiving a radio-frequency signal at a predetermined frequency band;
    a level changing section for changing a signal level of the radio-frequency signal received by the antenna;
    a subsequent-stage circuit for performing predetermined signal processing for the radio-frequency signal whose signal level is changed at the level changing section;
    a detecting section for detecting a signal level of the radio-frequency signal for which the signal processing is performed by the subsequent-stage circuit; and
    a control section for setting a rate of change of the radio-frequency signal, based on the signal level of the radio-frequency signal detected by the detecting section, so that the signal level of the radio-frequency signal detected by the detecting section does not exceed a first value,
    wherein the control section generates a control signal smaller than a predetermined level when the signal level of the radio-frequency signal detected by the detecting section is greater than a second value which is smaller than the first value, and the control section generates a control signal having the predetermined level when the signal level of the radio-frequency signal detected by the detecting section is smaller than the second value,
    wherein the level changing section includes:
        a grounded-emitter amplifying transistor;
        a bias circuit for applying a bias voltage to a base of the amplifying transistor;
        a control transistor connected to the amplifying transistor in cascode connection; and
        an output circuit connected to a collector of the control transistor,
    wherein the amplifying transistor amplifies the radio-frequency signal that is inputted to the base and to which the bias voltage is applied,
    wherein the control transistor controls a gain of the amplifying transistor so as to become a gain based on the control signal that is generated at the control section and is inputted to the base, and
    wherein the output circuit outputs the amplified radio-frequency signal from the collector of the control transistor.

2. A receiving circuit for a radio communication apparatus comprising:
    an antenna for receiving a radio-frequency signal at a predetermined frequency band;
    a level-changing section for changing a signal level of the radio-frequency signal received by the antenna;
    a subsequent-stage circuit for performing predetermined signal processing for the radio-frequency signal whose signal level is changed at the level changing section;
    a detecting section for detecting a signal level of the radio-frequency signal for which the signal processing is performed by the subsequent-stage circuit; and
    a control section for setting a rate of change of the radio-frequency signal, based on the signal level of the radio-frequency signal detected by the detecting section, so that the signal level of the radio-frequency signal detected by the detecting section does not exceed a first value,
    wherein the detecting section includes:
    a level detecting transistor with an emitter to which the radio-frequency signal, which is outputted from the subsequent-stage circuit, is inputted;
    a bias circuit for applying a predetermined bias voltage to a base of the level detecting transistor; and
    an output circuit for converting a radio-frequency signal, which is outputted from a collector of the level detecting transistor, to a direct current,
    wherein the level detecting transistor outputs, from the collector, a radio-frequency signal that is inputted to the emitter and whose signal level is greater than a second value which is smaller than the first value and is determined by the predetermined bias voltage, and
    wherein the control section generates a control signal smaller than a predetermined signal level when the direct current outputted from the output circuit is greater than a current level, and the control section generates a control signal having the predetermined signal level when the direct current outputted from the output circuit is smaller than the current level.

3. A receiving circuit for a radio communication apparatus comprising:
an antenna for receiving a radio-frequency signal at a predetermined frequency band;
a level-changing section for changing a signal level of the radio-frequency signal received by the antenna;
a subsequent-stage circuit for performing predetermined signal processing for the radio-frequency signal whose signal level is changed at the level changing section;
a detecting section for detecting a signal level of the radio-frequency signal for which the signal processing is performed by the subsequent-stage circuit;
a control section for setting a rate of change of the radio-frequency signal, based on the signal level of the radio-frequency signal detected by the detecting section, so that the signal level of the radio-frequency signal detected by the detecting section does not exceed a first value;
a frequency conversion circuit for converting a frequency of the radio-frequency signal outputted from the subsequent-stage circuit to a frequency lower than the frequency of the radio-frequency signal; and
a bias circuit connected to an input section of the frequency conversion circuit,
wherein the control section sets a gain of the level changing section to a gain smaller than a predetermined gain when the signal level of the radio-frequency signal detected by the detecting section is greater than a second value which is smaller than the first value, and the control section sets a gain of the level changing section to a predetermine gain when the signal level of the radio-frequency signal detected by the detecting section is smaller than the second value, and the detecting section detects a consumption current of the bias circuit.

4. The receiving circuit according to claim 3, wherein the subsequent-stage circuit is a bandlimiting filter for outputting, from among the radio-frequency signals outputted from the level changing section, only a signal within the predetermined frequency band to the detecting section.

5. The receiving circuit according to claim 4, wherein the bandlimiting filter has frequency characteristics not allowing a transmission signal, which is outputted from a transmission circuit in the wireless communication apparatus, to be outputted to the detecting section.

* * * * *